US012696470B2

(12) United States Patent
Wu

(10) Patent No.: US 12,696,470 B2
(45) Date of Patent: Jul. 28, 2026

(54) METHOD FOR MANUFACTURING HIGH-ELECTRON-MOBILITY TRANSISTOR

(71) Applicant: Ultraband Technologies Inc., Zhubei City (TW)

(72) Inventor: Chan-Shin Wu, Zhubei City (TW)

(73) Assignee: ULTRABAND TECHNOLOGIES, INC., Zhubei City (TW)

( * ) Notice: Subject to any disclaimer, the term of this patent is extended or adjusted under 35 U.S.C. 154(b) by 447 days.

(21) Appl. No.: 18/207,405

(22) Filed: Jun. 8, 2023

(65) Prior Publication Data

US 2023/0402526 A1 Dec. 14, 2023

Related U.S. Application Data

(60) Provisional application No. 63/350,847, filed on Jun. 9, 2022.

(51) Int. Cl.
| | |
|---|---|
| *H10D 30/01* | (2025.01) |
| *H10D 30/47* | (2025.01) |
| *H10D 64/00* | (2025.01) |
| *H10D 64/01* | (2025.01) |
| *H10D 64/23* | (2025.01) |

(52) U.S. Cl.
CPC ........... *H10D 30/015* (2025.01); *H10D 64/01* (2025.01)

(58) Field of Classification Search
CPC .... H10D 30/015; H10D 64/01; H10D 64/111; H10D 64/112; H10D 30/475
See application file for complete search history.

(56) References Cited

U.S. PATENT DOCUMENTS

| | | | |
|---|---|---|---|
| 2013/0112986 A1 | 5/2013 | Hsiung et al. | |
| 2015/0243775 A1* | 8/2015 | Haeberlen .......... | H10D 62/8503 |
| | | | 257/194 |
| 2017/0317202 A1* | 11/2017 | Green ................. | H01L 23/3171 |
| 2017/0338332 A1* | 11/2017 | Tadjer .............. | H01L 21/02458 |
| 2017/0365671 A1 | 12/2017 | Nakano et al. | |
| 2020/0006521 A1 | 1/2020 | Banerjee et al. | |
| 2020/0312983 A1 | 10/2020 | You et al. | |
| 2021/0151592 A1* | 5/2021 | Lee ..................... | H10D 30/475 |
| 2021/0184010 A1 | 6/2021 | Chong et al. | |

FOREIGN PATENT DOCUMENTS

CN 114127951 A 3/2022

* cited by examiner

*Primary Examiner* — Monica D Harrison
*Assistant Examiner* — Jacob T Nelson

(57) ABSTRACT

A method for manufacturing a high-electron-mobility transistor includes the following steps: providing a semiconductor substrate, wherein the semiconductor substrate includes a channel layer and a barrier layer on the channel layer; forming a protective layer on the semiconductor substrate at a position corresponding to a gate opening; forming an overlay layer on the semiconductor substrate in an area around the protective layer, and removing the protective layer to form the gate opening; and forming a p-type layer in and at the gate opening and on the overlay layer.

17 Claims, 21 Drawing Sheets

100

110
108
106
104
102

METHOD FOR MANUFACTURING HIGH-ELECTRON-MOBILITY TRANSISTOR

CROSS REFERENCE TO RELATED APPLICATIONS

This application claims priority of U.S. Provisional Application No. 63/350,847 filed on Jun. 9, 2022 under 35 U.S.C. § 119(e), the entire contents of all of which are hereby incorporated by reference

BACKGROUND OF THE INVENTION

1. Technical Field

The present invention relates to a method for manufacturing a transistor, and more particularly to a method for manufacturing a high-electron-mobility transistor.

2. Description of Related Art

In the semiconductor industry, high-voltage switching transistors such as high-electron-mobility transistors (HEMT), junction field-effect transistors (JFET), and power metal-oxide-semiconductor field-effect transistors (power MOSFET) are often used as the semiconductor switching elements in high-voltage high-power devices. High-electron-mobility transistors, in particular, have been in more and more extensive use because when applied to a device working in a high-voltage environment, they cause little, if any, damage to the device thanks to, among other advantages, their high power densities, high breakdown voltages, high output voltages, and high switching frequencies.

The superior properties of high-electron-mobility transistors are attributable mainly to the material properties of gallium nitride (GaN), such as a wide bandgap, a high critical electric field, and high carrier mobility. In addition, due to the unique polarization effect of GaN, an undoped aluminum gallium nitride (AlGaN)/GaN heterostructure can form an induced two-dimensional electron gas (2DEG) in an interface area, making it possible for an AlGaN/GaN HEMT to work by outputting a large current while exhibiting a very low ON-resistance.

In practice, a high-electron-mobility transistor may be implemented as an enhancement-mode (E-mode) semiconductor device; i.e., a normally OFF structure with a positive threshold voltage. To do so, the high-electron-mobility transistor is typically provided with a p-type layer that corresponds to and is under the gate and that includes a p-type dopant so as to deplete the two-dimensional electron gas while the transistor is not biased and to thereby remain normally OFF. Currently, such a structure is generally made by forming the p-type layer after the source and the drain are formed. When patterning the p-type layer, therefore, it is required that a special etching process be used to remove the p-type layer partially, and that during the etching process, neither should the layer under the p-type layer be etched, nor should the metal of the electrodes be contaminated, the objective being to prevent a leakage of electricity from taking place in the resulting transistor and to protect the transistor from malfunctioning. One example of such special etching processes is atomic layer etching (ALE), which is a technique for removing a thin layer of material by sequential self-limiting reactions.

BRIEF SUMMARY OF THE INVENTION

The foregoing atomic layer etching method, however, is costly and has a high technical threshold, not to mention being time-consuming. To ensure that a transistor has a sufficiently high threshold voltage (Vth), the barrier layer of the transistor generally should not be too thick. Nevertheless, the inventor of the present invention has found that a transistor made by the aforesaid method may have surface damage on the barrier layer as a result of over-etching and therefore has a lowered product yield, and that the deficient region in the spacing between the source, the gate, and the drain may deepen such that the ON-resistance (Rds(ON)) of the transistor is increased due to the reduced amount of electric charges. In view of this, the inventor of the present invention came up with the following concept: To begin with, a protective layer is formed on the barrier layer of a semiconductor substrate at a position corresponding to the gate to be formed. Next, an overlay layer is selectively formed around the protective layer based on the material difference between the protective layer and the overlay layer and the material properties of the protective layer itself, and the protective layer is subsequently removed to form a gate opening. After that, a p-type layer is formed in and at the gate opening and on the overlay layer. The process stated above not only allows a relatively easy etching method to be used to remove the protective layer and thereby form the gate opening, but also uses the overlay layer to protect the barrier layer from being affected by the p-type layer, which is formed later than the overlay layer. Consequently, the patterning of the p-type layer is made simple. Based on this concept, the invention allows the variables involved in the threshold voltage and ON-resistance of a transistor to be individually controlled. More specifically, the invention not only can prevent product yield from lowering and the ON-resistance from increasing, but also provides a higher tolerance for the thickness of the barrier layer than in the prior art to ensure that the product has a sufficiently high threshold voltage.

In light of the above, one aspect of the present invention provides a method for manufacturing a high-electron-mobility transistor, wherein the method includes the steps of: (a) providing a semiconductor substrate, wherein the semiconductor substrate includes a channel layer and a barrier layer on the channel layer; (b) forming a protective layer on the semiconductor substrate at a position corresponding to a gate opening; (c) forming an overlay layer on the semiconductor substrate in an area around the protective layer, and removing the protective layer to form the gate opening; and (d) forming a p-type layer in and at the gate opening and on the overlay layer.

In one embodiment of the present invention, the method for manufacturing a high-electron-mobility transistor further includes the steps of: (e) forming and patterning a first dielectric layer on the overlay layer such that the first dielectric layer exposes the overlay layer at positions corresponding respectively to a source opening and a drain opening, and performing a platform separation process; (f) performing an etching process at the positions corresponding respectively to the source opening and the drain opening in order to form the source opening and the drain opening; (g) forming and patterning an ohmic contact metal layer in and at the source opening and the drain opening, and alloying the ohmic contact metal layer; (h) forming and patterning a second dielectric layer such that the second dielectric layer covers the first dielectric layer partially; (i) forming and patterning a first metal layer such that the first metal layer covers areas corresponding respectively to the source opening, the gate opening, and the drain opening, covers the first dielectric layer partially, and covers the second dielectric layer partially; and (j) forming and patterning a second metal layer such that the second metal layer covers areas corresponding respectively to the source opening and the drain opening and covers the first metal layer partially.

In one embodiment of the present invention, the method for manufacturing a high-electron-mobility transistor further includes: patterning the p-type layer after completion of step (d), such that the p-type layer is confined in and at the gate opening.

In one embodiment of the present invention, the protective layer includes silicon nitride as an ingredient, and the thickness of the protective layer is greater than the thickness of the overlay layer. Preferably, the protective layer is 20 to 75 nm thick.

In one embodiment of the present invention, the overlay layer is 15 to 50 nm thick, and the barrier layer is 12 to 25 nm thick.

In one embodiment of the present invention, the material of the overlay layer is the same as the material of the barrier layer.

In one embodiment of the present invention, the protective layer is formed by low-pressure chemical vapor deposition (LPCVD).

In one embodiment of the present invention, the method for manufacturing a high-electron-mobility transistor further includes the step, to be performed before the protective layer is formed, of: forming an in-situ dielectric layer on the barrier layer. Preferably, the in-situ dielectric layer is 20 to 50 nm thick.

In one embodiment of the present invention, the p-type layer is 2.5 to 3 μm wide.

In one embodiment of the present invention, the first dielectric layer covers the p-type layer partially.

In one embodiment of the present invention, the first dielectric layer is formed and patterned by LPCVD.

In one embodiment of the present invention, each of the source opening and the drain opening is a groove that exposes the channel layer partially. Preferably, each of the grooves has at least one lateral side and a bottom side, wherein the lateral side and the bottom side form an angle of 30 to 90 degrees. Preferably, the ohmic contact metal layer is alloyed at a process temperature of 500° C. to 550° C.

In one embodiment of the present invention, the second dielectric layer is formed and patterned by plasma-enhanced chemical vapor deposition (PECVD).

In one embodiment of the present invention, the thickness of the second dielectric layer is less than or equal to 500 nm.

In summary of the above, the method provided by the present invention for manufacturing a high-electron-mobility transistor makes good use of the differences in lattice matching properties between, and the various advantages of, the protective layer, the barrier layer, and the overlay layer such that the p-type layer can be provided and patterned before the source and the drain are formed. This not only prevents product yield from lowering and the ON-resistance of the transistor from increasing, but also provides a higher tolerance for the thickness of the barrier layer than in the prior art to ensure that the product has a sufficiently high threshold voltage. Therefore, the method provided by the invention for manufacturing a high-electron-mobility transistor not only can effectively reduce the cost and time of manufacture in comparison with the prior art, but also lowers the technical threshold of manufacture and can increase product yield.

BRIEF DESCRIPTION OF THE SEVERAL VIEWS OF THE DRAWINGS

The foregoing and other objectives, features, advantages, and embodiments of the present invention can be better understood by referring to the following detailed description in conjunction with the accompanying drawings, in which.

Figure 1:
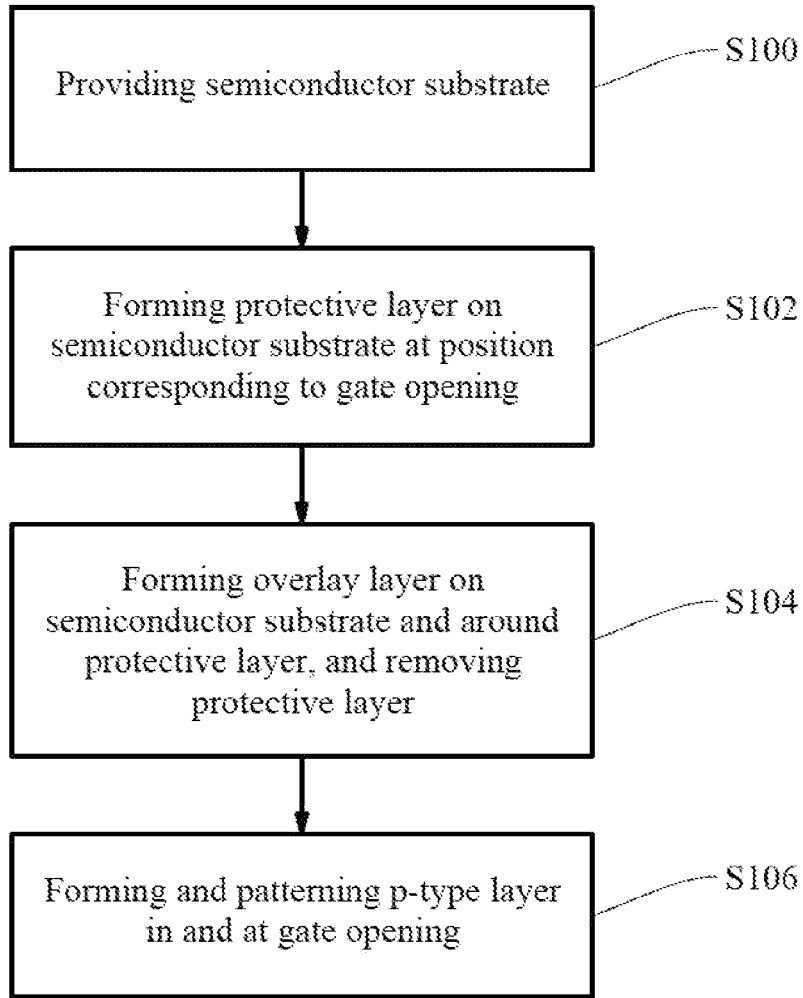
FIG. 1 and FIG. 2 are flow charts of the method for manufacturing a high-electron-mobility transistor according to one embodiment of the invention.

As is conventionally done, the features and elements shown in the drawings are not drawn to scale but are drawn to best illustrate specific features and elements that are related to the present invention. In addition, identical or similar reference numerals are used throughout the drawings to indicate similar elements or parts.

DETAILED DESCRIPTION OF THE INVENTION

To disclose the present invention thoroughly and completely, an explanatory description of certain implementation modes and embodiments of the invention is given below. Those implementation modes and embodiments, however, are not the only ways in which the invention can be implemented or used. In this specification and the appended claims, the terms "a" and "said" may be construed as referring to plural referents unless otherwise stated in the context. Moreover, unless otherwise stated, the term "provided on an article" as used in this specification and the appended claims may be construed as being directly or indirectly attached to a surface of the article or as contacting the surface of the article in other ways, wherein the definition of the surface should be determined according to the context and common knowledge in the art.

While all the numerical ranges and parameters used to define the present invention are approximate values, the related values in the embodiments are presented herein as accurately as possible. It is essentially inevitable, however, that each value has a standard deviation attributable to the individual testing method employed to determine the value. As used herein, the term "about" generally indicates that the actual value is within ±10%, 5%, 1%, or 0.5% of a specific value or numerical range, or the term "about" indicates that the actual value is within an acceptable standard error of a mean. A person of ordinary skill in the art will be able to determine which of the two meanings of the term "about" applies. Therefore, unless stated to the contrary, all the numerical parameters disclosed in this specification and the appended claims are approximate values and can be changed as appropriate. Those numerical parameters should be construed at least as values having the specified significant digits and obtained by applying a common carry method.

Terminology

As used herein, the term "high-electron-mobility transistor" may refer to a naturally normally ON structure that has a negative threshold voltage and that can be converted into a normally OFF structure having a positive threshold voltage. In addition, the "semiconductor material" in the present invention may include chemical compounds of various elements, wherein the elements include, but are not limited to, gallium (Ga) and nitrogen (N). In fact, such a chemical compound may include one or more elements of a certain group in the periodic table and one or more elements of a different group in the periodic table. For example, such a chemical compound may include a matching combination of an element of group 13 (i.e., the group including boron (B), aluminum (Al), gallium (Ga), indium (In), and thallium (Tl)) and an element of group 15 (i.e., the group including nitrogen (N), phosphorus (P), arsenic (As), antimony (Sb), and bismuth (Bi)), or a matching combination of elements of group 14 (i.e., the group including carbon (C), silicon (Si), germanium (Ge), and tin (Sn)), such as silicon carbide (SiC) and a silicon-germanium alloy. Groups 13 to 15 in the periodic table are also known as group III, group IV, and group V respectively.

As used herein, the term "expose" refers to bringing an object into a condition in which a surface of the object is not completely covered, and in which the surface of the object may form one or a plurality of opening or groove structures. The specific definition of the term, however, should be determined according to the context and common knowledge in the art.

As used herein, the term "suitable epitaxial growth or deposition process" includes, but is not limited to, chemical vapor deposition (CVD), low-pressure CVD (LPCVD), atmospheric-pressure CVD (APCVD), ultrahigh-vacuum CVD (UHVCVD), atomic layer deposition (ALD), molecular layer deposition (MLD), plasma-enhanced CVD (PECVD), metal-organic CVD (MOCVD), molecular-beam epitaxy (MBE), sputtering, and a combination of the above.

As used herein, the term "photoresist" refers to a photosensitive material that is commonly used in the processing process of an integrated circuit or semiconductor device, and that shows a difference in solubility when illuminated or irradiated with ultraviolet light, deep ultraviolet light, an electron beam, an ion beam, an X-ray, or the like, thereby allowing a surface of an object to be patterned according to the user's purpose. A photoresist can be categorized as a positive photoresist or a negative photoresist. With a positive photoresist, a pattern identical to the mask in use can be obtained after exposure and development. Conversely, the negative pattern of a mask can be obtained if a negative photoresist is used.

As used herein, the term "mask/reticle" refers to a light-shielding device that is commonly used in the processing process of an integrated circuit or semiconductor device to define the pattern to be formed on a surface of an object. A mask/reticle is used in conjunction with a photoresist to carry out a patterning process.

As used herein, the term "lift-off process" refers to a process that is performed after a metal area is formed by illuminating the corresponding negative photoresist, and that involves dissolving a sacrifice layer by etching so as to lift off the metal attached to, and not intended to be part of, the metal area.

As used herein, the term "suitable etching process" includes, but is not limited to, dry etching and wet etching. Dry etching includes such physical bombardment methods as reactive-ion etching (RIE) and inductively-coupled-plasma (ICP) etching. Wet etching includes etching with a chemical solution, as is well known in the art.

The following description of the present invention is provided to enable a person of ordinary skill in the art to understand the essential technical contents of the invention easily. The invention can be changed or modified in many ways that aim to adapt the invention to different uses or situations but do not depart from the spirit or scope of the invention. All such alternative embodiments shall be viewed as falling within the scope of the appended claims.

EMBODIMENTS

Figure 2:
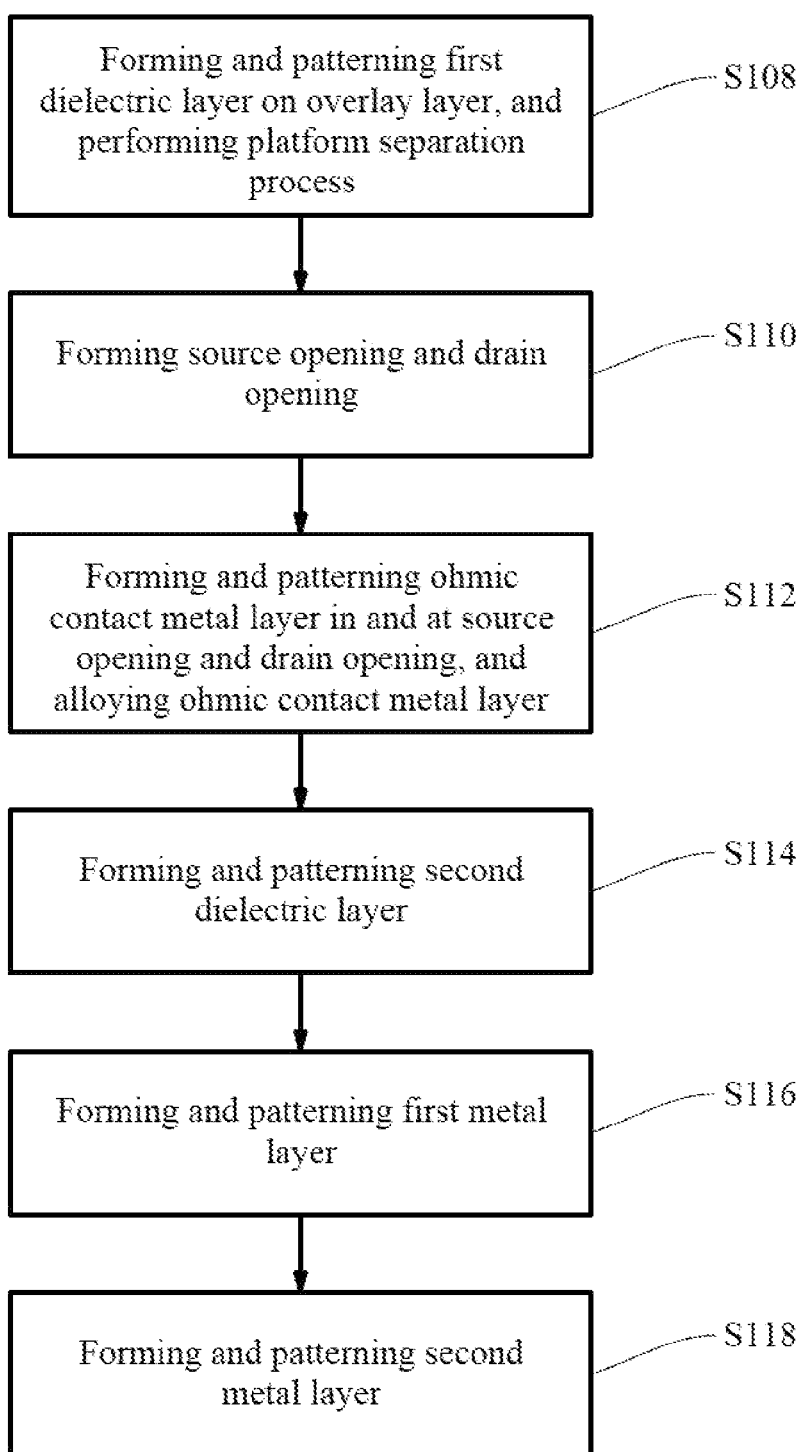

FIG. 1 and FIG. 2 are flow charts of the method for manufacturing a high-electron-mobility transistor according to one embodiment of the present invention, and FIG. 3 to FIG. 14 are sectional views showing the various stages of the structure of a high-electron-mobility transistor manufactured by the method according to one embodiment of the invention.

Referring to FIG. 1, the present invention provides a method for manufacturing a high-electron-mobility transistor, and the method generally includes: step S100 of providing a semiconductor substrate; step S102 of forming a protective layer on the semiconductor substrate at a position corresponding to a gate opening; step S104 of forming an overlay layer on the semiconductor substrate in an area around the protective layer, and removing the protective layer; and step S106 of forming and patterning a p-type layer in and at the gate opening.

Referring to FIG. 2, the method of the present invention for manufacturing a high-electron-mobility transistor further includes: step S108 of forming and patterning a first dielectric layer on the overlay layer, and performing a platform separation process; step S110 of forming a source opening and a drain opening; step S112 of forming and patterning an ohmic contact metal layer in and at the source opening and the drain opening, and alloying the ohmic contact metal layer; step S114 of forming and patterning a second dielectric layer; step S116 of forming and patterning a first metal layer; and step S118 of forming and patterning a second metal layer.

Figure 3:
FIGS. 3, 4A-4D, 5A, 5B, 6A-6C, 7A, 7B, and 8-14 are sectional views showing the various stages of the structure of a high-electron-mobility transistor manufactured by the method according to one embodiment of the invention.
Figure 4A:
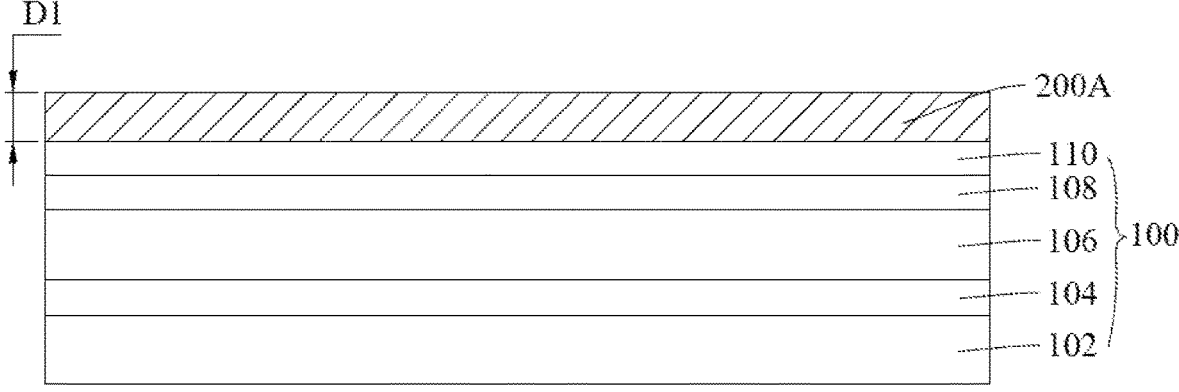
Figure 4B:
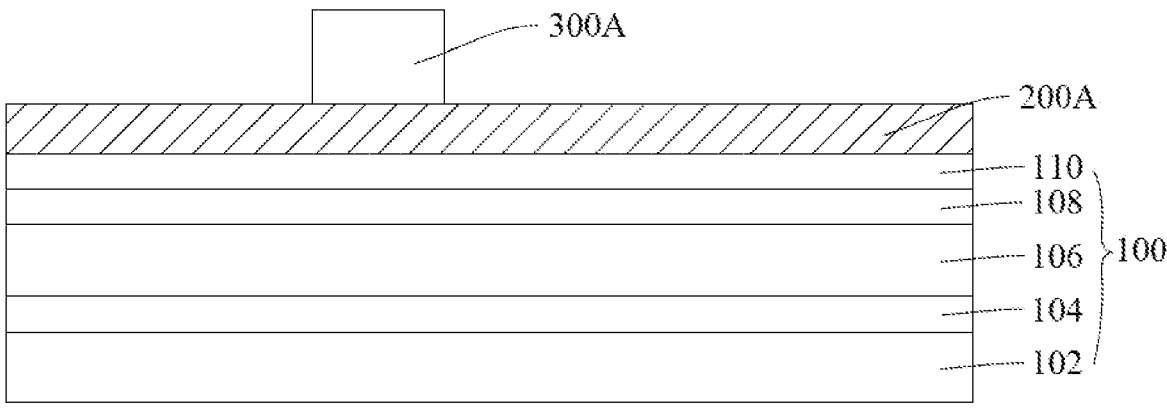
Figure 4C:
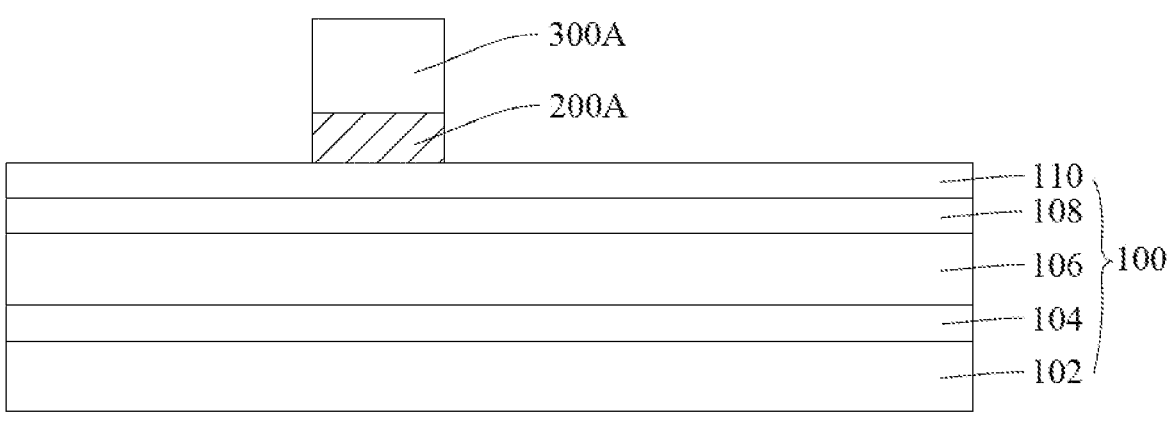
Figure 4D:
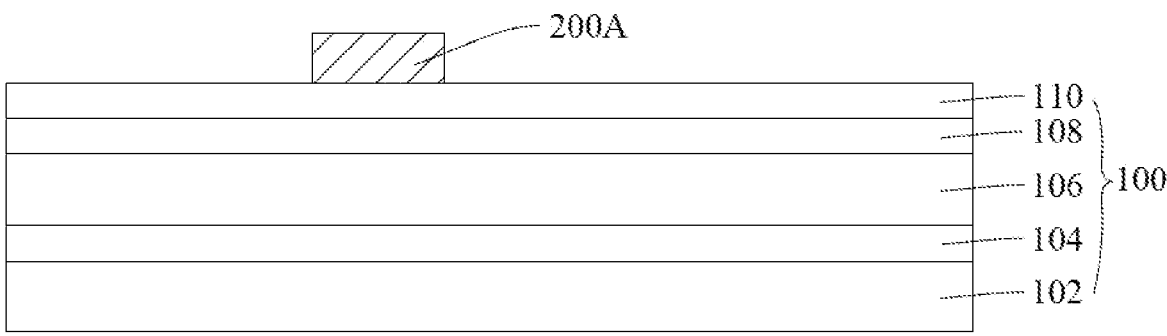

Please refer to FIG. 3 in conjunction with FIG. 1, with FIG. 3 showing the semiconductor substrate 100 provided in step S100. In some embodiments of the present invention, the semiconductor substrate 100 is a structure provided for an aluminum gallium nitride (AlGaN)/gallium nitride (GaN)-based high-electron-mobility transistor and is an epitaxially grown layered structure. More specifically, the semiconductor substrate 100 includes a channel layer 108 and a barrier layer 110 provided on the channel layer 108, with a heterogeneous material interface formed between the channel layer 108 and the barrier layer 110 such that a two-dimensional electron gas area is developed in a portion of the channel layer 108 that is adjacent to the interface. When biased, the two-dimensional electron gas area forms conduction channels for free electrons and thereby enables, for example, electrical coupling to the source and the drain. More specifically, the material of the channel layer 108 is undoped GaN or GaN that is not intentionally doped, and the thickness of the channel layer 108 is 50 to 1000 nm, such as 50 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 950 nm, or 1000 nm. The material of the barrier layer 110 is undoped $Al_xGa_{1-x}N$ or $Al_xGa_{1-x}N$ that is not intentionally doped, where x ranges from about 0.1 to about 1. The thickness of the barrier layer 110 is 10 to 40 nm, such as 10 nm, 15 nm, 20 nm, 25 nm, 30 nm, 35 nm, or 40 nm.

In a preferred embodiment of the present invention as shown in the drawings, the semiconductor substrate 100 has a layered structure composed of, sequentially from the bottom up, a base 102, a nucleation layer 104, a buffer layer 106, the channel layer 108, and the barrier layer 110. In a more preferred embodiment, a cap layer (not shown) is provided on the barrier layer 110 and has a thickness of 1.5 to 2 nm, such as 1.5 nm, 1.6 nm, 1.7 nm, 1.8 nm, 1.9 nm, or 2 nm. The base 102 includes a wafer and must be insulated. For example, the base 102 is a wafer made of a high-quality monocrystalline semiconductor material such as sapphire, GaN, gallium arsenide (GaAs), silicon crystal, any SiC polymorph (including wurtzite), aluminum nitride (AlN), indium phosphide (InP), or other similar base materials for use in semiconductors. The nucleation layer 104 may include an undoped AlN compound or an AlN compound that is not intentionally doped. The buffer layer 106 is provided to compensate for any mismatch between the layers and includes undoped GaN, GaN that is not intentionally doped, or carbon-doped GaN.

Please refer to FIG. 4A to FIG. 4D in conjunction with FIG. 1, with FIG. 4A to FIG. 4D showing the structural changes corresponding to the formation of a protective layer 200A on the semiconductor substrate 100 at a position corresponding to a gate opening in step S102. To start with, the material of the protective layer 200A is provided on the semiconductor substrate 100 by a suitable epitaxial growth or deposition process. Here, the protective layer 200A must be able to withstand a high-temperature epitaxy process and must also be different from the barrier layer 110 in terms of lattice matching properties so as to provide selectivity during the manufacturing process. Furthermore, it is important that the protective layer 200A does not produce excessive stress or react with the barrier layer 110. Preferably, the process by which the protective layer 200A is formed is low-pressure chemical vapor deposition carried out at a process temperature higher than 800° C., such as 850° C., 900° C., 950° C., 1000° C., 1050° C., or 1100° C. In addition, the material of the protective layer 200A is at least one of silicon dioxide ($SiO_2$), silicon oxynitride ($SiON_x$), and silicon nitride ($SiN_x$) (with x being about 0.1 to 1), preferably $SiN_x$. The protective layer 200A has a thickness D1 of 20 to 75 nm, such as 20 nm, 25 nm, 30 nm, 35 nm, 40 nm, 45 nm, 50 nm, 55 nm, 60 nm, 65 nm, 70 nm, or 75 nm. In some preferred embodiments of the present invention, the protective layer 200A is formed after an in-situ dielectric layer (not shown) of the same material is formed on the semiconductor substrate 100, wherein the in-situ dielectric layer has a thickness of 20 to 50 nm, such as 20 nm, 25 nm, 30 nm, 35 nm, 40 nm, 45 nm, or 50 nm. Without limitation by any specific theory, the in-situ dielectric layer can protect the barrier layer 110 (see FIG. 3) from contamination without affecting the threshold voltage of the transistor manufactured.

Next, the protective layer 200A is patterned with a mask 300A by a suitable etching process so that by removing the portion of the protective layer 200A that is no longer needed, the remaining protective layer 200A is located on the semiconductor substrate 100 at a specific position where the gate is intended to be formed, and can provide protection for the subsequently formed gate opening. More specifically, the width/length of the patterned protective layer 200A, which corresponds to the gate opening, should be greater than or equal to 7 μm, such as 7 μm, 8 μm, 9 μm, or 10 μm, test the material subsequently formed on the area exposed by removing the patterned protective layer 200A pile up at the edge. Preferably, the width/length is equal to the gate width (Wg) of the transistor manufactured.

Figure 5A:
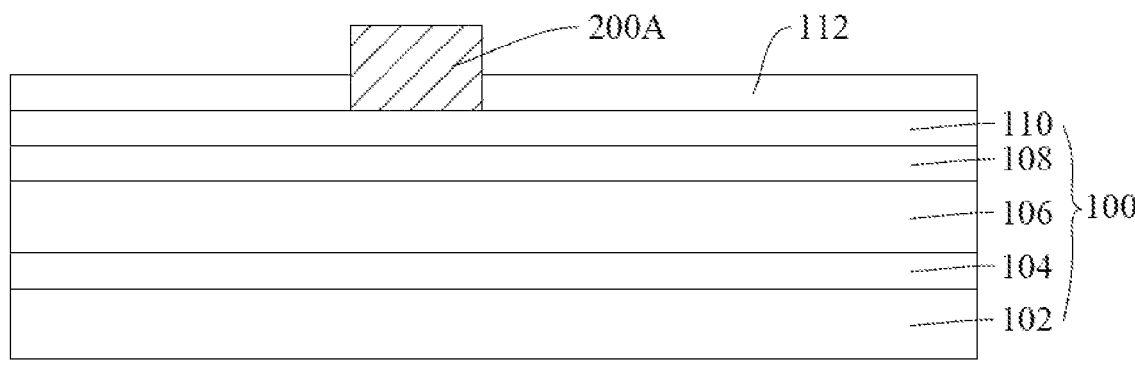
Figure 5B:
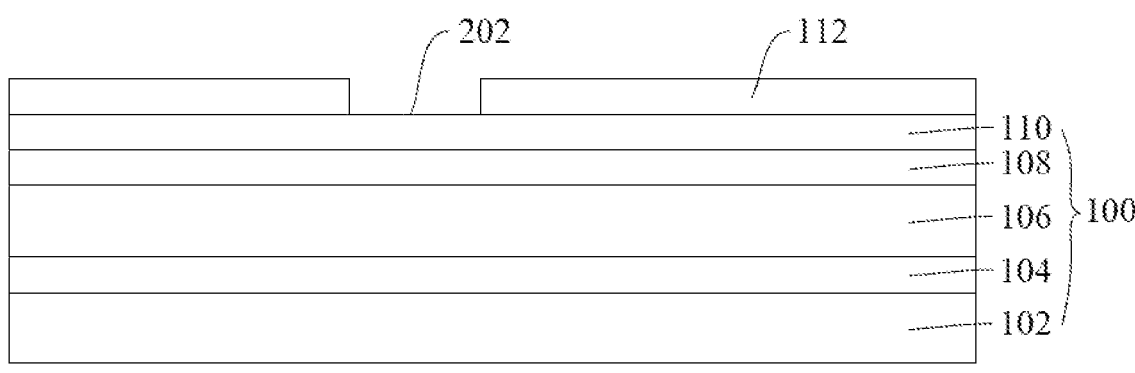

Please refer to FIG. 5A and FIG. 5B in conjunction with FIG. 1, with FIG. 5A and FIG. 5B showing the structural changes corresponding to the formation of an overlay layer 112 on the semiconductor substrate 100 in an area around the protective layer 200A (or more particularly the patterned protective layer 200A) and to the removal of the protective layer 200A (or more particularly the patterned protective layer 200A) in step S104. Here, the material of the overlay layer 112 is provided on the semiconductor substrate 100 by a suitable epitaxial growth or deposition process. The overlay layer 112 is used to provide a relatively high upper limit of transconductance, a relatively high saturated current, a relatively high current-gain cutoff frequency, and a relatively high maximum oscillation frequency, and to lower the drain-source ON-resistance (Rds(ON)). The material of the overlay layer 112 is the same as that of the barrier layer 110 (see FIG. 3), i.e., both being undoped $Al_xGa_{1-x}N$ or $Al_xGa_{1-x}N$ that is not intentionally doped, where x ranges from about 0.1 to about 1. The thickness of the overlay layer 112 is 15 to 50 nm, such as 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm. In some preferred embodiments of the present invention, the thickness of the overlay layer 112 is less than or equal to one half of the thickness of the protective layer 200A.

Based on its lattice matching properties, the overlay layer 112 will be deposited selectively on a surface portion of the semiconductor substrate 100 that is not covered by the protective layer 200A (i.e., not covered by the patterned protective layer 200A); in other words, the overlay layer 112 will be formed around the protective layer 200A (i.e., around the patterned protective layer 200A). Without limitation by any specific theory, the overlay layer 112 can also serve as an extension of the barrier layer 110 (see FIG. 3) and thereby increase the charge density of the channel layer 108 (see FIG. 3). This preferably allows the amount of electric charges in an individual layer of the resulting transistor to be controlled so as to achieve the desired breakdown voltage. The present invention preferably also allows the thickness of the barrier layer 110 to be reduced so that the resulting transistor has a higher threshold voltage (Vth). More specifically, the thickness of the barrier layer may be 12 to 25 nm, such as 12 nm, 13 nm, 14 nm, 15 nm, 16 nm, 17 nm, 18 nm, 19 nm, 20 nm, 21 nm, 22 nm, 23 nm, 24 nm, or 25 nm. The protective layer 200A (or more particularly the patterned protective layer 200A) is then selectively removed to form a gate opening 202, exposing the portion of the semiconductor substrate 100 on which the gate is intended to be formed. More specifically, based on the differences in structure and ingredient between the protective layer 200A and the overlay layer 112, the protective layer 200A (or more particularly the patterned protective layer 200A) in this embodiment is selectively removed by a suitable etching process, and this allows the gate opening 202 to be formed in a simpler and easier way than in the prior art.

Figure 6A:
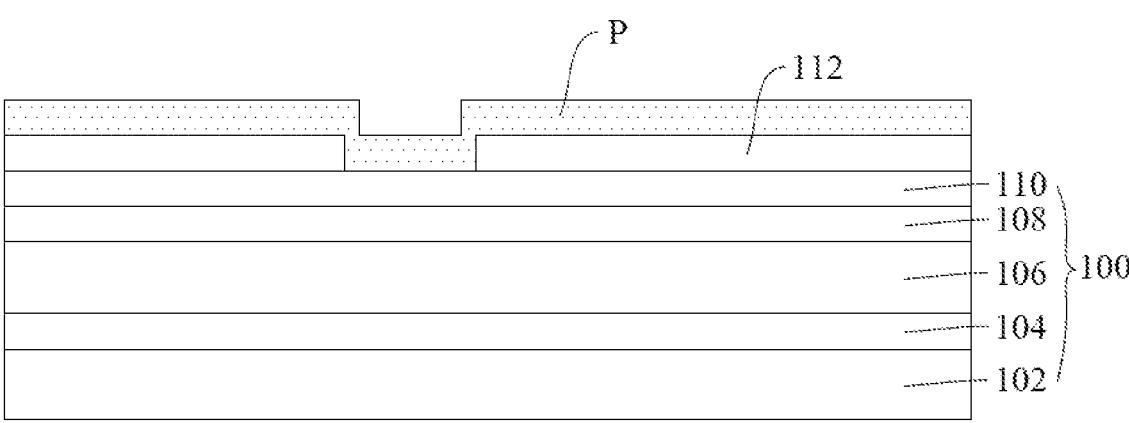
Figure 6B:
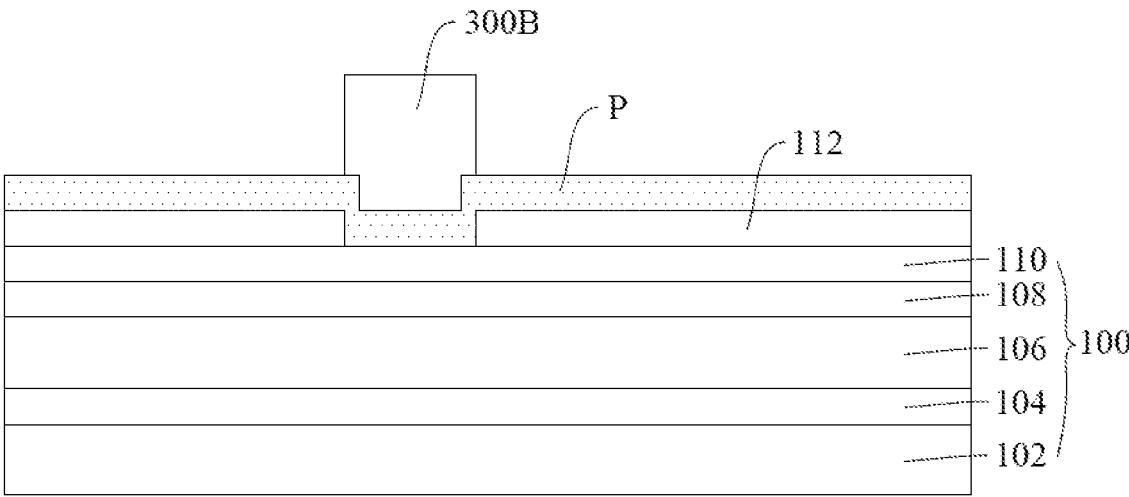
Figure 6C:
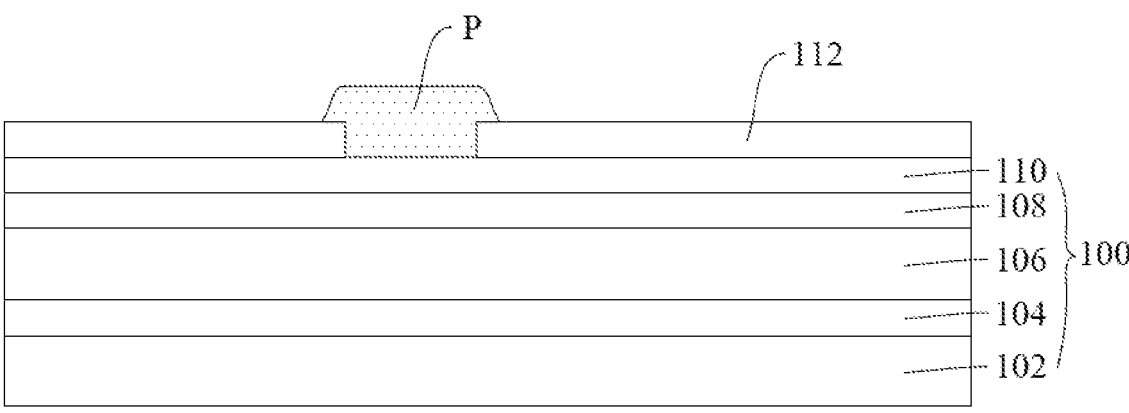

Please refer to FIG. 6A to FIG. 6C in conjunction with FIG. 1, with FIG. 6A to FIG. 6C showing the structural changes corresponding to the formation and patterning of a p-type layer P in and at the gate opening 202 in step S106. Here, the material of the p-type layer P is provided on and over the semiconductor substrate 100 by a suitable epitaxial growth or deposition process. Preferably, the process is metal-organic chemical vapor deposition carried out at a process temperature of 800° C. to 1200° C., such as 850° C., 900° C., 950° C., 1000° C., 1050° C., 1100° C., 1150° C., or 1200° C.

In terms of material, the p-type layer P may include a p-type gallium nitride (p-GaN), a p-type aluminum gallium nitride (p-AlGaN), or a p-type silicon carbide (p-SiC). Preferably, the p-type layer P includes a p-GaN that preferably has a p-type dopant such as magnesium (Mg). Due to its lattice matching properties, the p-type layer P will be deposited in and at the gate opening 202 and on the overlay layer 112 as a whole when formed.

After that, the p-type layer P is patterned with a mask 300B by a suitable etching process so that by removing the portion of the p-type layer P that is no longer needed, the remaining p-type layer P is located at a specific position corresponding to the gate opening 202 and forms a preliminary gate structure. In some embodiments of the present invention, the thickness of the p-type layer P is 50 to 90 nm, such as 50 nm, 55 nm, 60 nm, 65 nm, 70 nm, 75 nm, 80 nm, 85 nm, or 90 nm. In some embodiments of the invention, the width of the p-type layer P is 2.5 to 3 μm, such as 2.5 μm, 2.6 μm, 2.7 μm, 2.8 μm, 2.9 μm, or 3 μm.

In some preferred embodiments of the present invention, the thickness of the overlay layer 112 is set at 30 to 50 nm, such as 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm, in order to reduce the effect the p-type layer P may have on the electric charges in the channel layer 108, which lies below the overlay layer 112. Thus, once the material of the p-type layer P is provided on and over the semiconductor substrate 100 by a suitable epitaxial growth or deposition process, there is no need to pattern the p-type layer P and confine the p-type layer P at a position corresponding to the gate opening 202, and the manufacturing process will be simplified as a result.

Figure 7A:
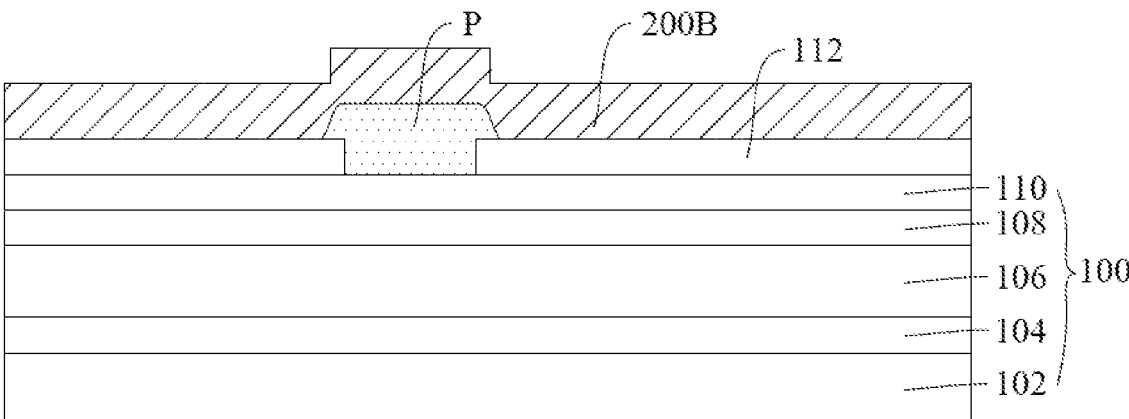
Figure 7B:
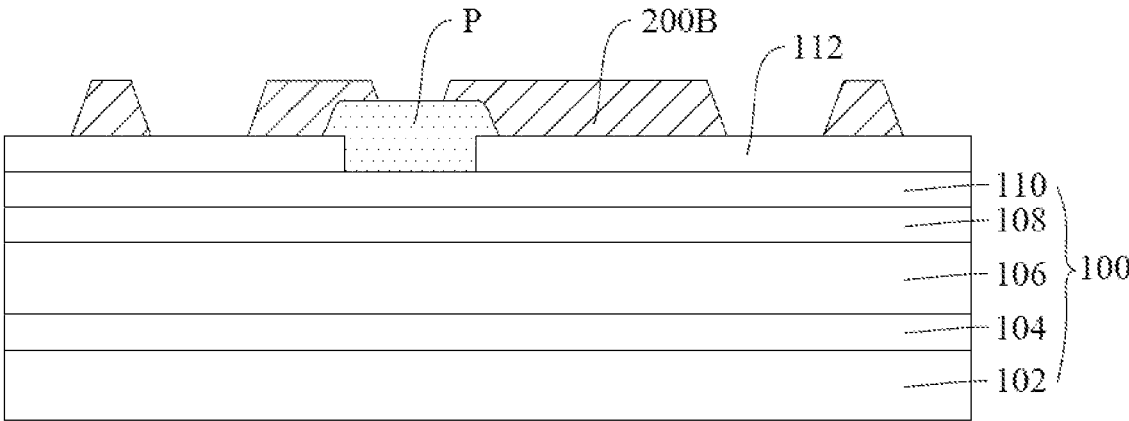
Figure 8:
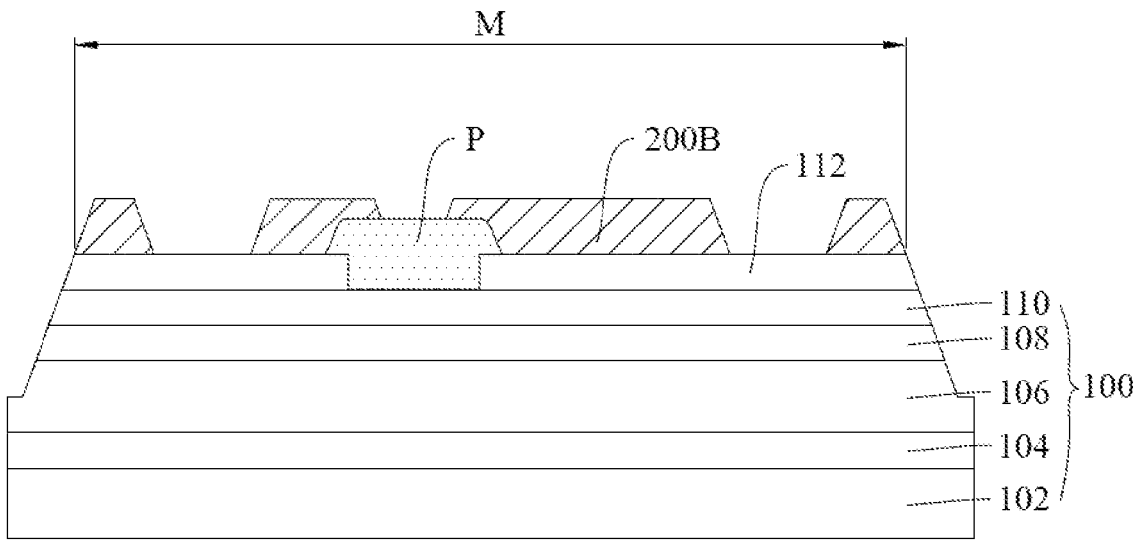

Please refer to FIG. 7A, FIG. 7B, and FIG. 8 in conjunction with FIG. 2, with FIG. 7A, FIG. 7B, and FIG. 8 showing the structural changes corresponding to the formation and patterning of a first dielectric layer 200B on the overlay layer 112 and to the platform separation process in step S108. To begin with, the material of the first dielectric layer 200B is deposited on the entire top surface of the semiconductor substrate 100 (or more particularly on the p-type layer P and the overlay layer 112) by a suitable epitaxial growth or deposition process. Preferably, the process is low-pressure chemical vapor deposition carried out at a process temperature higher than 800° C., such as 850° C., 900° C., 950° C., 1000° C., 1050° C., or 1100° C. In addition, the material of the first dielectric layer 200B is preferably at least one of $SiO_2$, $SiON_x$, and $SiN_x$ (with x being about 0.1 to 1) so that the first dielectric layer 200B can serve as a field plate in the resulting high-electron-mobility transistor. The thickness of the first dielectric layer 200B is 150 to 300 nm, such as 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, or 300 nm.

The first dielectric layer 200B is then patterned by a suitable etching process in order to define the positions where the source and the drain are intended to be formed respectively. After that, a platform separation process is performed by a suitable etching process in order to define an active region M, allowing the device (i.e., transistor) manufactured to work independently of, and not to affect, another such device. In some embodiments of the present invention, the platform separation process can be performed by not only a suitable etching process, but also a suitable ion implantation process for changing the electric resistance of the affected layers and thereby defining the active region M. Preferably, the platform separation process is carried out by a combination of a suitable etching process and a suitable ion implantation process.

Figure 9:
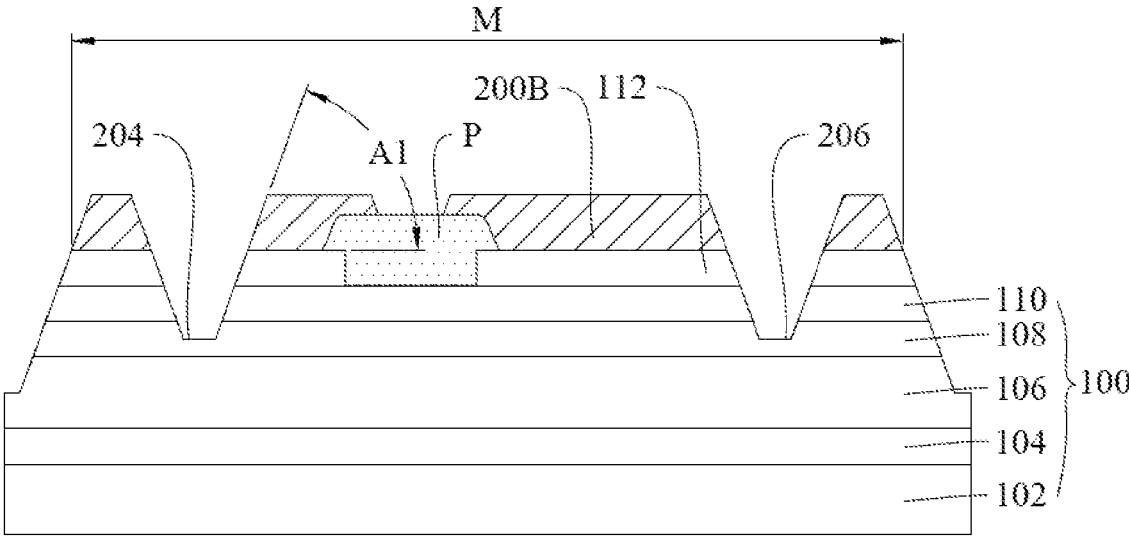

Please refer to FIG. 9 in conjunction with FIG. 2, with FIG. 9 showing the structural change corresponding to the formation of a source opening 204 and a drain opening 206 in step S110. In this step, the portions of the first dielectric layer 200B that correspond respectively to the positions where the source and the drain are intended to be formed are etched downward as deep as the channel layer 108 by a suitable etching process so as to form the source opening 204 and the drain opening 206. More specifically, each of the source opening 204 and the drain opening 206 is a groove with at least one lateral side and a bottom side (the latter being an exposed surface portion of the channel layer 108), wherein the lateral side and the bottom side form an angle A1 of 30 to 90 degrees, such as 30, 35, 40, 45, 50, 55, 60, 65, 70, 75, 80, 85, or 90 degrees, preferably 60 degrees. Without limitation by any specific theory, an angle A1 within the foregoing range allows the electrode metal to contact the barrier layer 110 and the channel layer 108 more effectively during the subsequent electrode forming step, and this will be advantageous to conduction through the two-dimensional electron gas area.

Figure 10:
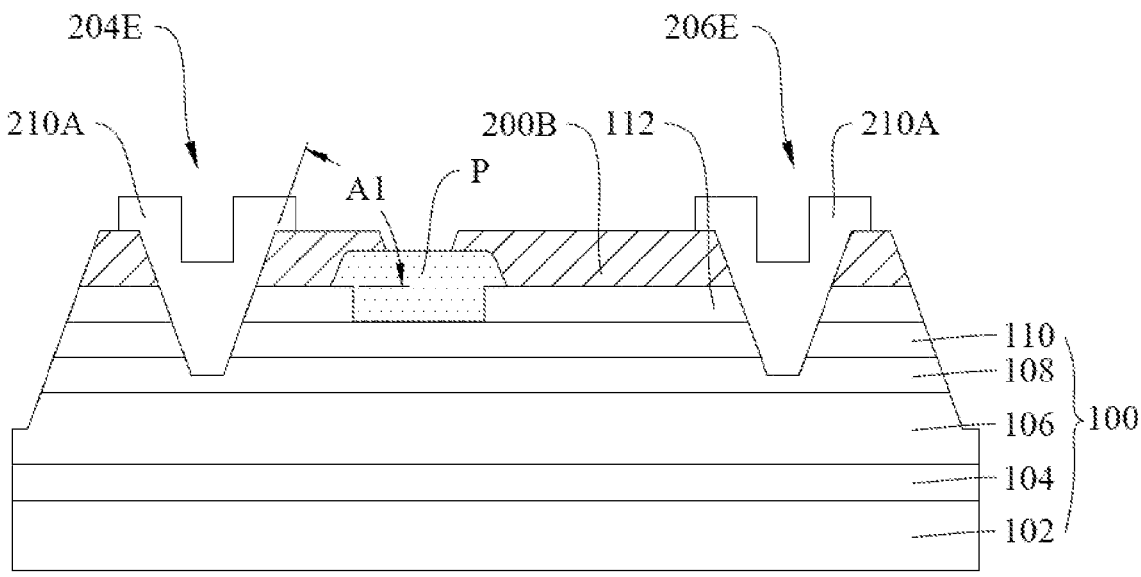
Figure 11:
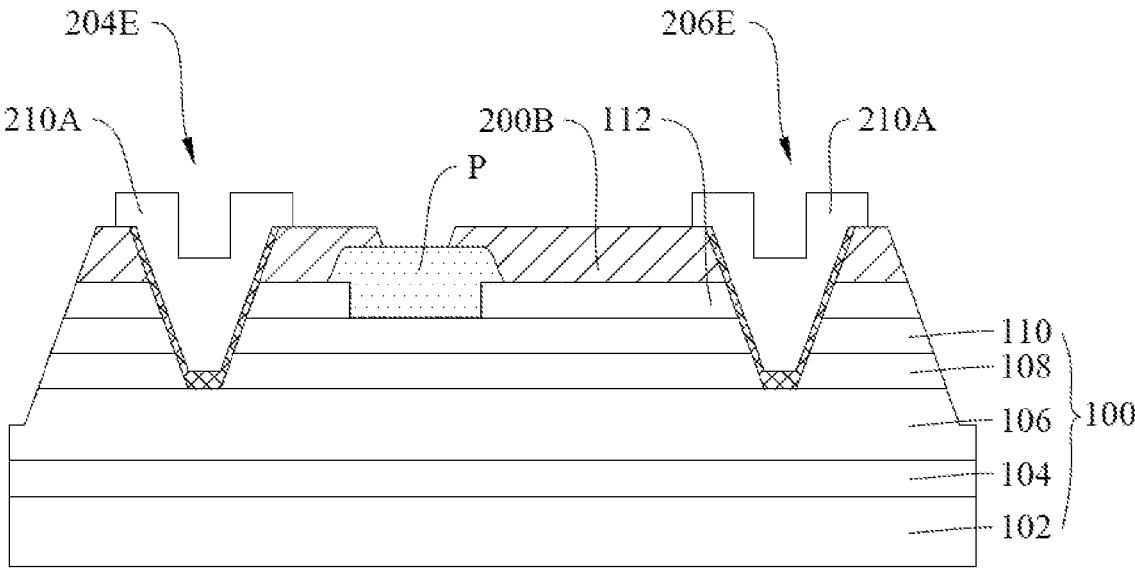

Please refer to FIG. 10 and FIG. 11 in conjunction with FIG. 2, with FIG. 10 and FIG. 11 showing the structural changes corresponding to the formation and patterning of an ohmic contact metal layer 210A in and at the source opening 204 and the drain opening 206 and to the alloying of the ohmic contact metal layer 210A in step S112. Here, the ohmic contact metal layer 210A is formed with a suitable mask by a suitable epitaxial growth or deposition process so that when the mask is removed, the ohmic contact metal layer 210A is confined in and at the source opening 204 and the drain opening 206. Following that, the ohmic contact metal layer 210A, which is formed in and at the source opening 204 and the drain opening 206, is alloyed (see FIG. 11) by an alloying process in order to form the source 204E and the drain 206E and establish ohmic contact within the resulting high-electron-mobility transistor. In some preferred embodiments of the present invention, and without limitation by any specific theory, the fact that the channel layer 108 is partially exposed through the bottom side of the source opening 204 and the bottom side of the drain opening 206 makes it possible for the alloying process to be carried out at a process temperature substantially lower than that in the prior art, preferably at a process temperature of 500° C. to 550° C., such as 500° C., 510° C., 520° C., 530° C., 540° C., or 550° C. In some other preferred embodiments of the invention, the ohmic contact may be established instead by forming a highly doped n-type gallium nitride layer (not shown) on the bottom side of the source opening 204 and the bottom side of the drain opening 206, with the carrier concentration preferably higher than $10^{19}$ ns*cm$^{-3}$, or more preferably by molecular beam epitaxy (MBE) with a carrier concentration higher than $10^{20}$ ns*cm$^{-3}$. Each of these two alternative processes can be used in place of, or to simplify, the alloying process. In some embodiments of the invention, the ohmic contact metal layer 210A may be made of any suitable electrically conductive material that can form ohmic contact points or other electrically conductive surfaces, preferably titanium (Ti)/aluminum (Al)/nickel (Ni)/tantalum (Ta)/molybdenum (Mo)/gold (Au).

Figure 12:
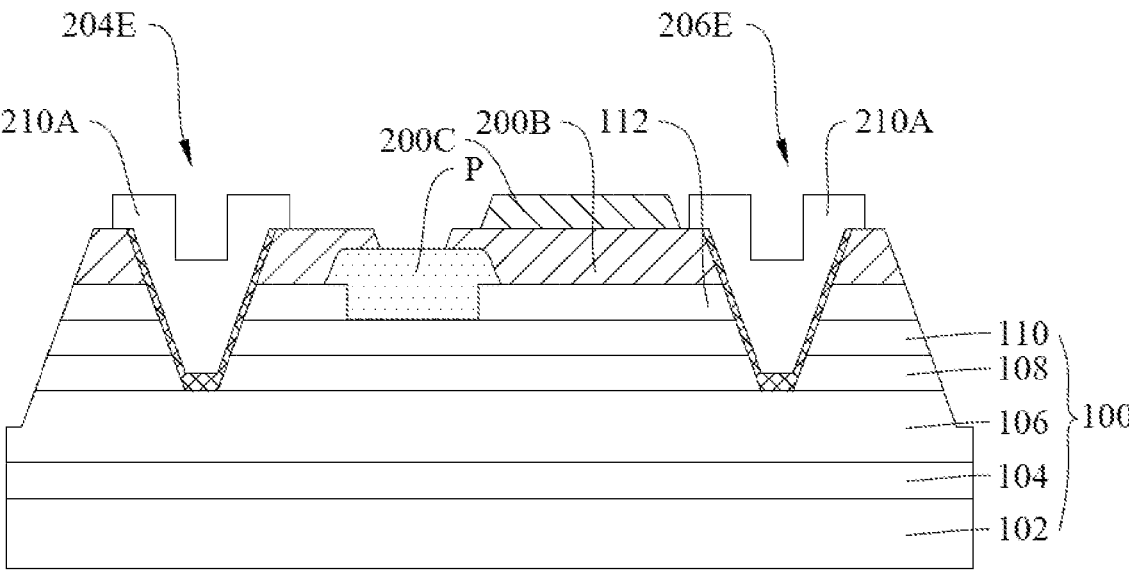

Please refer to FIG. 12 in conjunction with FIG. 2, with FIG. 12 showing the structural change corresponding to the formation and patterning of a second dielectric layer 200C in step S114. Following the formation of the source 204E and the drain 206E, the second dielectric layer 200C is formed and patterned in order to cover the first dielectric layer 200B partially. In some embodiments of the present invention, the material of the second dielectric layer 200C may be the same as or different from that of the first dielectric layer 200B and is preferably at least one of $SiO_2$, $SiON_x$, and $SiN_x$ (with x being about 0.1 to 1). The second dielectric layer 200C may serve as a field plate in the resulting high-electron-mobility transistor. In a preferred embodiment of the invention, the material of the first dielectric layer 200B is different from that of the second dielectric layer 200C. For example, the material of the first dielectric layer 200B is $SiN_x$ while the material of the second dielectric layer 200C is $SiO_2$. The difference in material allows the formation and patterning of the second dielectric layer 200C to be achieved by selective etching. The thickness of the second dielectric layer 200C is less than 500 nm and preferably 200 to 300 nm, such as 200 nm, 210 nm, 220 nm, 230 nm, 240 nm, 250 nm, 260 nm, 270 nm, 280 nm, 290 nm, or 300 nm. In addition, the area of the first dielectric layer 200B that is covered by the second dielectric layer 200C is located substantially between the p-type layer P and the drain 206E; the invention, however, has no limitation on the size of the covered area.

Figure 13:
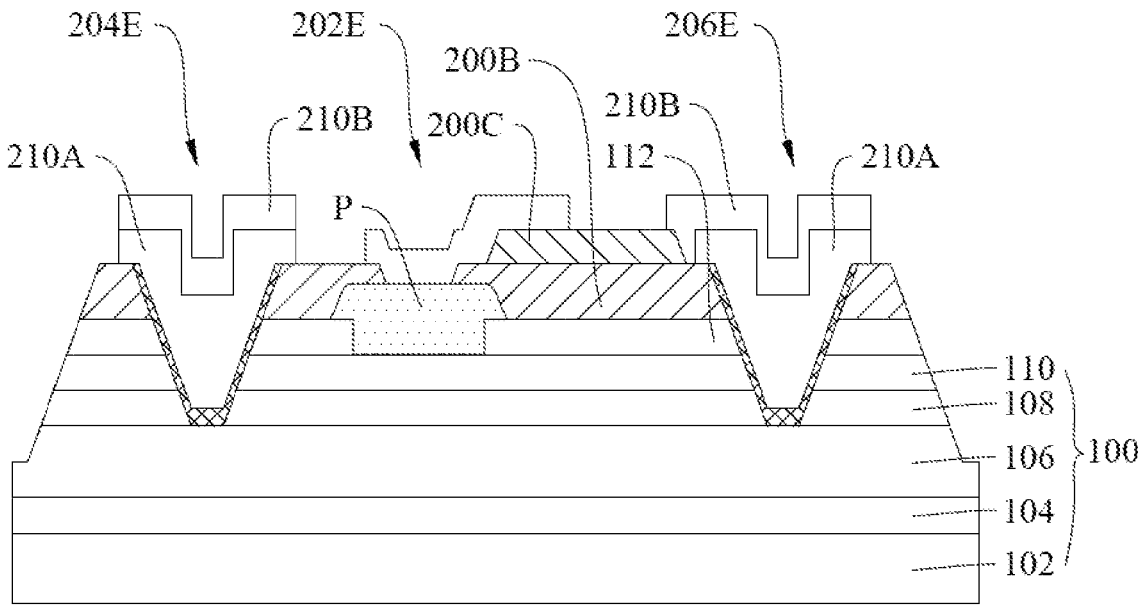

Please refer to FIG. 13 in conjunction with FIG. 2, with FIG. 13 showing the structural change corresponding to the formation and patterning of a first metal layer 210B in step S116. In this step, the first metal layer 210B is formed and patterned in order to cover the p-type layer P, a portion of the first dielectric layer 200B, and a portion of the second dielectric layer 200C. More specifically, the first metal layer 210B may be formed with a suitable mask by a suitable epitaxial growth or deposition process so that the patterned first metal layer 210B is obtained when the mask is removed. The first metal layer 210B covers the p-type layer P and thereby forms the gate 202E. The first metal layer 210B also covers each of the first dielectric layer 200B and the second dielectric layer 200C partially. The present invention has no limitation on the sizes of the areas covered by the first metal layer 210B. In some embodiments of the invention, the first metal layer 210B may be made of any electrically conductive material that can bias or otherwise control a semiconductor device, preferably nickel (Ni)/gold (Au) or zirconium (Zr)/gold (Au).

Figure 14:
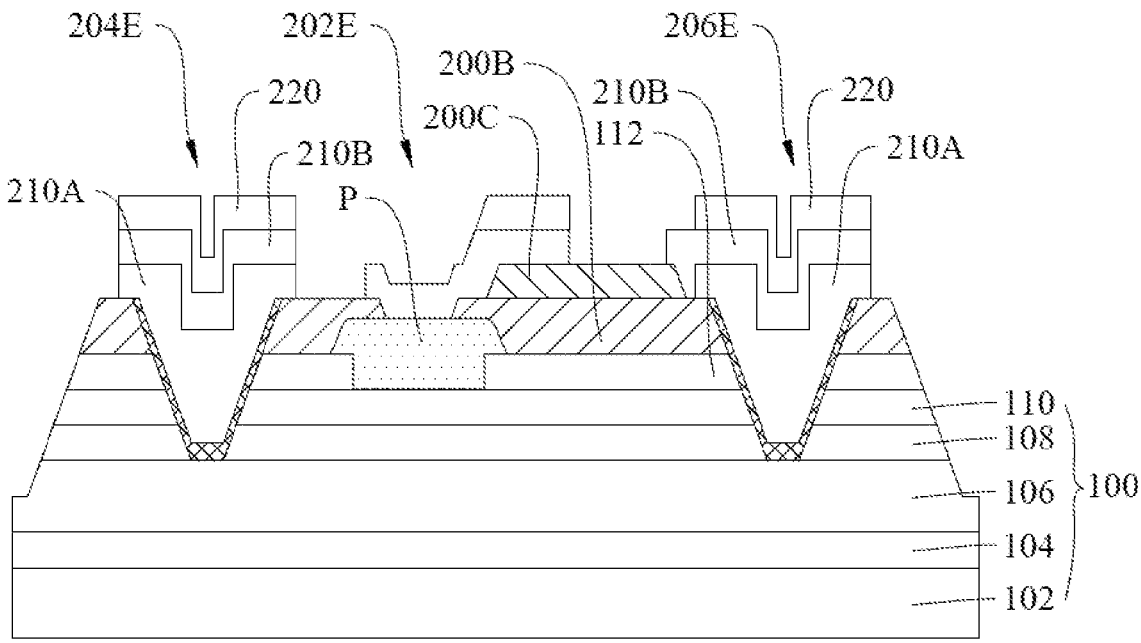

Please refer to FIG. 14 in conjunction with FIG. 2, with FIG. 14 showing the structural change corresponding to the formation and patterning of a second metal layer 220 in step S118. The second metal layer 220 and a jumper layer (not shown) are formed and patterned after step S116 is completed. Each of the second metal layer 220 and the jumper layer is formed by a suitable epitaxial growth or deposition process and then patterned with a specific mask and/or photoresist in order to be confined in an area outside the gate 202E. The second metal layer 220 is used to electrically connect the same type of electrodes of different devices and may be made of any suitable electrically conductive material. The jumper layer is used as an electrical isolation layer between different electrodes to prevent the conduction between different electrodes in a circuit block where such conduction is not desired. The jumper layer, therefore, may be made of any suitable non-conductive material, such as a silicon-containing material.

In some embodiments of the present invention, the foregoing steps are preferably followed by the formation and patterning of a passivation layer (not shown). The passivation layer is formed by a suitable epitaxial growth or deposition process and then patterned with a specific mask and photoresist. The passivation layer is made of an organic/inorganic dielectric material, preferably at least one of $SiO_2$, $SiON_x$, and $SiN_x$ (with x being about 0.1 to 1).

According to the above, the method provided by the present invention for manufacturing a high-electron-mobility transistor makes good use of the differences in lattice matching properties between, and the various advantages of, the protective layer, the barrier layer, and the overlay layer such that the p-type layer can be provided and patterned before the source and the drain are formed. This not only prevents product yield from lowering and the ON-resistance of the transistor from increasing, but also provides a higher tolerance for the thickness of the barrier layer than in the prior art to ensure that the product has a sufficiently high threshold voltage. Therefore, the method provided by the invention for manufacturing a high-electron-mobility transistor not only can effectively reduce the cost and time of manufacture in comparison with the prior art, but also lowers the technical threshold of manufacture and can increase product yield.

While a detailed description of the present invention has been given above, the foregoing embodiments are only some preferred ones of the invention and are not intended to be restrictive of the scope of the invention. A person of ordinary skill in the art can make equivalent changes and modifications to the embodiments disclosed herein without departing from the spirit or scope of the invention, and all such changes and modifications shall be viewed as encompassed by the appended claims.

What is claimed is:

1. A method for manufacturing a high-electron-mobility transistor, comprising the steps of:

(a) providing a semiconductor substrate, wherein the semiconductor substrate comprises a channel layer and a barrier layer on the channel layer;

(b) forming a protective layer on the semiconductor substrate at a position corresponding to a gate opening;

(c) forming an overlay layer on the semiconductor substrate in an area around the protective layer, and removing the protective layer to form the gate opening;

(d) forming a p-type layer in and at the gate opening and on the overlay layer;

(e) forming and patterning a first dielectric layer on the overlay layer such that the first dielectric layer exposes the overlay layer at positions corresponding respectively to a source opening and a drain opening, and performing a platform separation process;

(f) performing an etching process at the positions corresponding respectively to the source opening and the drain opening in order to form the source opening and the drain opening; and (g) forming and patterning an ohmic contact metal layer in and at the source opening and the drain opening, and establishing ohmic contact, wherein said establishing ohmic contact is by forming an n-type gallium nitride layer on a bottom side of the source opening and a bottom side of the drain opening, with a carrier concentration higher than $10^{19}$ ns*$cm^3$, or by molecular beam epitaxy (MBE) with a carrier concentration higher than $10^{20}$ ns*$cm^{-3}$.

2. The method of claim 1, further comprising the steps of:

(h) forming and patterning a second dielectric layer such that the second dielectric layer covers the first dielectric layer partially;

(i) forming and patterning a first metal layer such that the first metal layer covers areas corresponding respectively to the source opening, the gate opening, and the drain opening, covers the first dielectric layer partially, and covers the second dielectric layer partially; and (j) forming and patterning a second metal layer such that the second metal layer covers areas corresponding respectively to the source opening and the drain opening and covers the first metal layer partially.

3. The method of claim 2, wherein the second dielectric layer is formed and patterned by plasma-enhanced chemical vapor deposition (PECVD).

4. The method of claim 2, wherein the second dielectric layer has a thickness less than or equal to 500 nm.

5. The method of claim 1, further comprising: patterning the p-type layer after completion of the step (d), such that the p-type layer is confined in and at the gate opening.

6. The method of claim 1, wherein the protective layer comprises silicon nitride as an ingredient, and the protective layer has a thickness greater than a thickness of the overlay layer.

7. The method of claim 6, wherein the thickness of the protective layer is 20 to 75 nm.

8. The method of claim 1, wherein the overlay layer has a thickness of 15 to 50 nm, and the barrier layer has a thickness of 12 to 25 nm.

9. The method of claim 1, wherein the overlay layer and the barrier layer are of a same material.

10. The method of claim 1, wherein the protective layer is formed by low-pressure chemical vapor deposition (LPCVD).

11. The method of claim 1, further comprising the step, to be performed before the protective layer is formed, of:

forming an in-situ dielectric layer on the barrier layer.

12. The method of claim 11, wherein the in-situ dielectric layer has a thickness of 20 to 50 nm.

13. The method of claim 1, wherein the p-type layer has a width of 2.5 to 3 μm.

14. The method of claim 1, wherein the first dielectric layer covers the p-type layer partially.

15. The method of claim 1, wherein the first dielectric layer is formed and patterned by low-pressure chemical vapor deposition (LPCVD).

16. The method of claim 1, wherein each of the source opening and the drain opening is a groove exposing the channel layer partially.

17. The method of claim 16, wherein each of the grooves has at least one lateral side and a bottom side, and the lateral side and the bottom side of each said groove form an angle of 30 to 90 degrees.

* * * * *